(12) United States Patent
Ponamgi

(10) Patent No.: US 9,946,832 B2
(45) Date of Patent: Apr. 17, 2018

(54) OPTIMIZED PLACEMENT DESIGN OF NETWORK AND INFRASTRUCTURE COMPONENTS

(71) Applicant: LENOVO ENTERPRISE SOLUTIONS (SINGAPORE) PTE. LTD., Singapore (SG)

(72) Inventor: Madhav Ponamgi, Furlong, PA (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 731 days.

(21) Appl. No.: 14/540,054

(22) Filed: Nov. 13, 2014

(65) Prior Publication Data

US 2016/0140259 A1 May 19, 2016

(51) Int. Cl.
*G06F 17/50* (2006.01)
*H04L 12/24* (2006.01)

(52) U.S. Cl.
CPC ........ *G06F 17/509* (2013.01); *G06F 17/50* (2013.01); *H04L 41/0826* (2013.01); *H04L 41/145* (2013.01); *Y04S 40/162* (2013.01)

(58) Field of Classification Search
CPC ...................................................... G06F 17/50
USPC ............................................................ 703/1
See application file for complete search history.

(56) References Cited

U.S. PATENT DOCUMENTS

| | | | |
|---|---|---|---|
| 8,595,262 B1 * | 11/2013 | Hayden | G06F 17/30545 370/252 |
| 9,317,336 B2 * | 4/2016 | Alicherry | G06F 9/5077 |
| 9,585,282 B1 * | 2/2017 | Gandhi | H05K 7/1492 |
| 2004/0103218 A1 * | 5/2004 | Blumrich | G06F 9/52 709/249 |
| 2013/0250802 A1 | 9/2013 | Yalagandula et al. | |

OTHER PUBLICATIONS

Dennis, A Guieded Tour of Daata-Center Networking, Jun. 2012.*
(Continued)

*Primary Examiner* — Lechi Truong
(74) *Attorney, Agent, or Firm* — Olive Law Group, PLLC

(57) ABSTRACT

Approaches presented herein enable optimization of a network and component configuration in a dense server environment. Specifically, an approach includes: constructing a plurality of populated racks, each selected so as to contain an optimized size and configuration of components constrained according to a set of user-selected requirements that specify a type, a quantity, and one or more characteristics of at least one of the set of components; optimizing a configuration of the populated racks to minimize a cable length between populated racks, the configuration adhering to, e.g., power requirements, cooling requirements, and weight requirements for the populated racks; and optimizing a position of a set of cable trays and corresponding junctions by reducing a number of cable tray channels associated with the cable length between populated racks. Taken together, these elements provide a repeatable approach for optimizing the number of cables, quantity of multiplexed connections, cable lengths, and switch/component placement.

20 Claims, 9 Drawing Sheets

(56) References Cited

OTHER PUBLICATIONS

Authors et al. Disclosed Anonymously, "Hand Held Device for Determining Optimum Rack Component Placement", IP.com No. IPCOM000219748D, IP.com Electronic Publication Date Jul. 10, 2012, 2 pages.
Andrew R. Curtis, "Reducing the Cost of Operating a Datacenter Network", AGM SIGCOMM Computer Communication Review, ACM New York, N.Y., USA, 153 pages.
Jayaram Mudigonda et al., "Taming the Flying Cable Monster: A Topology Design and Optimization Framework for Data-Center Networks", Proceedings of the 2011 USENIX Conference on USENIX Annual Technical Conference, USENIX Association, Berkley, CA, USA, 14 pages.

\* cited by examiner

US 9,946,832 B2

OPTIMIZED PLACEMENT DESIGN OF NETWORK AND INFRASTRUCTURE COMPONENTS

TECHNICAL FIELD

This invention relates generally to cloud and cluster design and, more specifically, to optimizing a placement/design of network and infrastructure components in a dense server environment.

BACKGROUND

The design of a networked cluster or cloud hardware infrastructure (e.g., a compute datacenter) that minimizes cost and satisfies performance requirements is becoming evermore complex given the trend toward centralized servers packed into dense configurations. A network designer has to consider a vast number of design choices including, but not limited to: the number of interfaces per switch, the size of the switches, and the type and length of network cabling (e.g., cables and connectors such as optical, copper, 1G, 10G, or 40G) interconnecting the network components. In addition, network designers also need to consider the physical space where the datacenter network is located, such as, a rack-based datacenter organized into rows of racks.

A portion of datacenter network costs can be attributed to the network cabling interconnecting the network components. For example, in large-scale Infiniband-based networked clusters, an individual cable can cost hundreds or thousands of dollars depending on the length and type. This is multiplied by the existence of potentially thousands of such cables deployed in a single cluster or cloud. Currently, the ad hoc methods used for cable planning and network capability often generate incorrect cable lengths and/or errors in connectivity/capacity. This has frequently resulted in massive re-cabling resulting in significant material and labor costs. The cumulative cost over thousands of installs can be substantial if these systems were improperly designed. Therefore, designing a datacenter network while reducing cabling and capacity costs is one of the key challenges faced by network designers today.

SUMMARY

In general, approaches presented herein enable optimization of a network and component configuration in a dense server environment, which are used to implement computer server farms such as clouds, clusters, or grids. Specifically, an approach includes: constructing a plurality of populated racks, each containing an optimized configuration of components constrained according to a set of user-selected requirements that specify a type, a quantity, and one or more characteristics of at least one of the set of components; optimizing a configuration of the populated racks in a system to minimize cable lengths between populated racks, the quality and quantity of the network connections, the configuration adhering to, e.g., power requirements, cooling requirements, and weight requirements for the populated racks; and optimizing a position of a set of cable trays and corresponding junctions in the configured populated racks by reducing a number of cable tray channels associated with the cable lengths between populated racks. In some embodiments, a Component Automated Placement (CAP) tool is used to create the optimized network and component placement for densely populated rack-based configurations made of, e.g., thousands of servers. Taken together, these elements provide a repeatable approach for optimizing the number of cables, quantity of multiplexed connections, cable lengths, and switch/component placement, thereby replacing ad hoc methods that produce inconsistent results. These approaches can also be used to modify or augment existing network and cluster configurations when additional servers are introduced and/or deleted.

One aspect of the present invention includes a method for optimizing a network composition and component configuration in a dense server environment, the method comprising the computer-implemented steps of: constructing a plurality of populated racks, each populated rack selected so as to contain an optimized size and configuration of a set of components constrained according to a set of user-selected requirements that specify a type and a quantity of one or more of the set of components, the set of components comprising one or more of the following: a set of servers, a set of compute nodes, and a set of switches; optimizing a configuration of the plurality of populated racks in a system to minimize cable lengths between populated racks in the plurality of populated racks, the configuration adhering to the following: power requirements for the plurality of populated racks, cooling requirements for the plurality of populated racks, and weight requirements for the plurality of populated racks; and optimizing a position of a set of cable trays and corresponding junctions in the configured plurality of populated racks by reducing a number of cable tray channels associated with the cables between populated racks of the plurality of populated racks.

Another aspect of the present invention includes a system for optimizing a network composition and component configuration in a dense server environment, comprising: a memory medium comprising program instructions; a bus coupled to the memory medium; and a processor, for executing the program instructions, coupled to a component automated placement (CAP) tool via the bus that when executing the program instructions causes the system to: construct a plurality of populated racks, each populated rack selected so as to contain an optimized size and configuration of a set of components constrained according to a set of user-selected requirements that specify a type and a quantity of one or more of the set of components, the set of components comprising one or more of the following: a set of servers, a set of compute nodes, and a set of switches; optimize a configuration of the plurality of populated racks in a system to minimize cable lengths between populated racks in the plurality of populated racks, the configuration adhering to the following: power requirements for the plurality of populated racks, cooling requirements for the plurality of populated racks, and weight requirements for the plurality of populated racks; and optimize a position of a set of cable trays and corresponding junctions in the configured plurality of populated racks by reducing a number of cable tray channels associated with the cable lengths between populated racks of the plurality of populated racks.

Yet another aspect of the present invention includes a computer program product for optimizing a network composition and component configuration in a dense server environment, the computer program product comprising a computer readable storage device, and program instructions stored on the computer readable storage device, to: construct a plurality of populated racks, each populated rack selected so as to contain an optimized size and configuration of a set of components constrained according to a set of user-selected requirements that specify a type and a quantity of one or more of the set of components, the set of components comprising one or more of the following: a set of servers, a set of compute nodes, and a set of switches; optimize a configuration of the plurality of populated racks in a system to minimize cable lengths between populated racks in the plurality of populated racks, the configuration adhering to the following: power requirements for the plurality of populated racks, cooling requirements for the plurality of populated racks, and weight requirements for the plurality of populated racks; and optimize a position of a set of cable trays and corresponding junctions in the configured plurality of populated racks by reducing a number of cable tray channels associated with the cable lengths between populated racks of the plurality of populated racks.

Still yet another aspect of the present invention includes a method for optimizing a network composition and component configuration in a dense server environment, comprising: providing a computer infrastructure operable to: construct a plurality of populated racks, each populated rack selected so as to contain an optimized size and configuration of a set of components constrained according to a set of user-selected requirements that specify a type and a quantity of one or more of the set of components, the set of components comprising one or more of the following: a set of servers, a set of compute nodes, and a set of switches; optimize a configuration of the plurality of populated racks in a system to minimize cable lengths between populated racks in the plurality of populated racks, the configuration adhering to the following: power requirements for the plurality of populated racks, cooling requirements for the plurality of populated racks, and weight requirements for the plurality of populated racks; and optimize a position of a set of cable trays and corresponding junctions in the configured plurality of populated racks by reducing a number of cable tray channels associated with the cable lengths between populated racks of the plurality of populated racks.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings in which.

Figure 1:
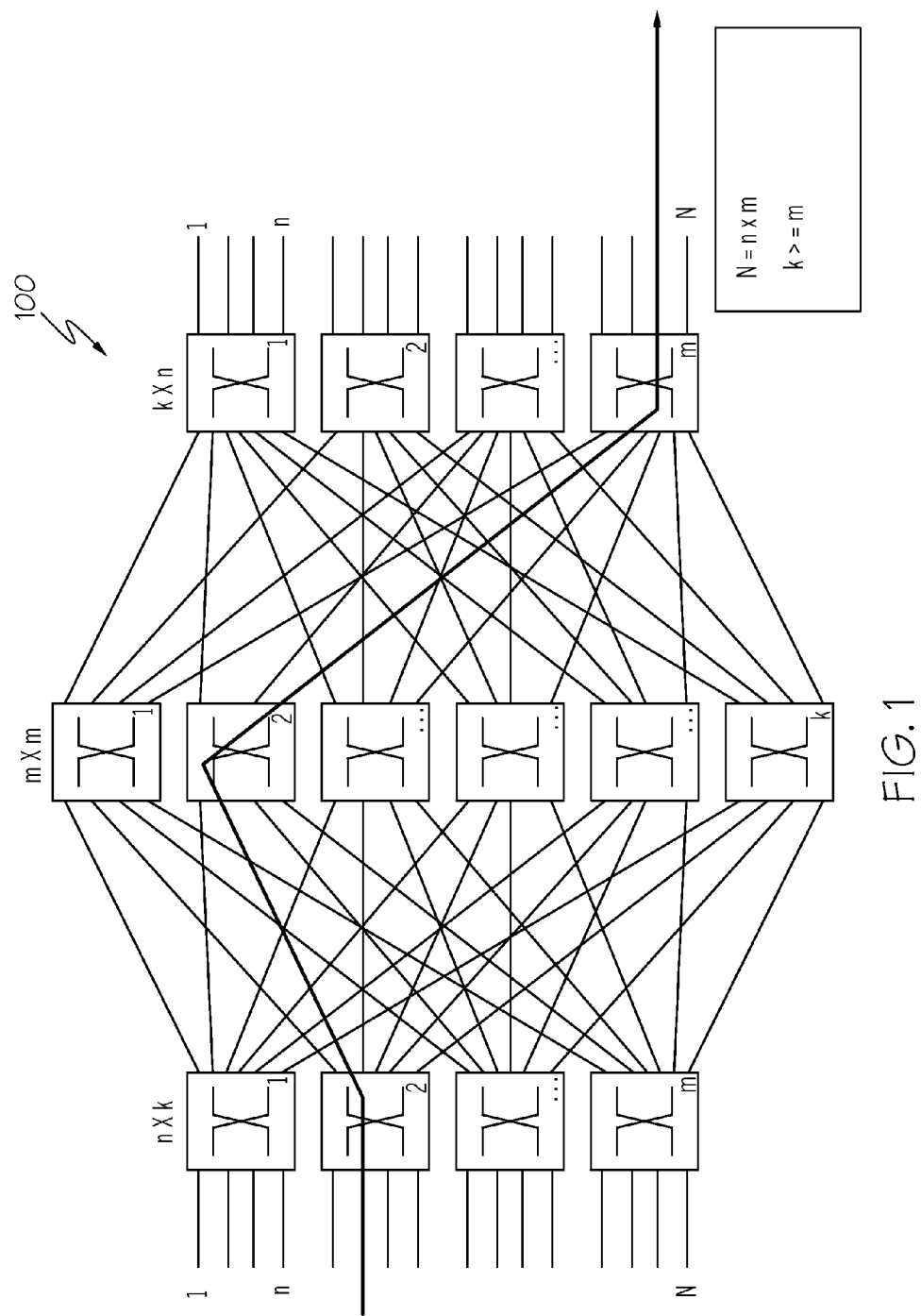
FIG. 1 shows an exemplary Clos-type network according to embodiments of the invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments now will be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Unless specifically stated otherwise, it may be appreciated that terms such as "processing," "detecting," "determining," "evaluating," "receiving," "constructing," "optimizing," "configuring," or the like, refer to the action and/or processes of a computer or computing system, or similar electronic data center device, that manipulates and/or transforms data represented as physical quantities (e.g., electronic) within the computing system's registers and/or memories into other data similarly represented as physical quantities within the computing system's memories, registers or other such information storage, transmission or viewing devices. The embodiments are not limited in this context.

As stated above, embodiments described herein provide optimization of a network and component configuration in a dense server environment. Specifically, an approach includes constructing a plurality of populated racks according to a set of user-selected requirements that specify a type, a quantity, and characteristics of one or more of the following components: compute nodes, switches, racks, and cable trays; configuring the plurality of populated racks in a system to optimize cable lengths between populated racks in the plurality of populated racks, while adhering to power requirements for the plurality of populated racks, cooling requirements for the plurality of populated racks, and weight requirements for the plurality of populated racks; and optimizing a position of a set of cable trays and corresponding junctions in the configured plurality of populated racks by reducing a number of cable tray channels associated with the cable lengths between populated racks of the plurality of populated racks. In some embodiments, a Component Automated Placement (CAP) tool is used to create the optimized network and component placement for densely populated rack-based configurations, e.g., made of thousands of servers. Taken together, these elements provide a repeatable approach for optimizing the number of cables, quantity of multiplexed connections, cable lengths and switch/component placement, thereby replacing ad hoc methods that produce inconsistent results. These approaches can also be used to modify or augment existing network and cluster configurations when additional servers are introduced and/or deleted.

Along these lines, it will be appreciated that embodiments of the invention are described in the context of a Clos-Network, which is a multi-stage (or a multi-switch) network representing a theoretical idealization of a practical multi-stage switching system. As shown in FIG. 1, exemplary Clos-network 100 is defined by three parameters: n, k and m, where n=number ingress sources, k=number of middle stage crossbar switches, and m=number of egress sources. One benefit of Clos-network 100 is that connection between a large number of input and output ports can be made by using only small-sized switches. A bipartite graph matching between the ports can be made by configuring the switches in all stages, as shown in FIG. 1. In this case, n represents the number of sources that feed into each of the m ingress stage crossbar switches. As can be seen, there is one connection between each ingress stage switch and each middle stage switch. Furthermore, each middle stage switch is connected once to each egress stage switch. It should be understood that a Clos-3 network is specifically shown in FIG. 1, but this can be converted to a Clos-2 tree network by reflecting the 3rd stage onto the initial input stage in another embodiment.

In another approach, embodiments of the invention can apply to Fat-tree networks, which are a variant of Clos networks with blocking factors. Blocking-factors determine the rate of over-subscription of a network. For example, when using industry standard 36-port Infiniband switches, if half the ports are used for input (18) and half are used for output (18) and k>=n, a fully non-blocking configuration is achieved, where the ratio of input/output is 1:1. Fully non-blocking is often not implemented due to cost or performance considerations, so it is common to have other ratios such as 2:1 (24 input/12 output), 3:1 (27 input/9 output), 5:1 (30 input/6 output), 8:1 (32 input/4 output), etc. Bonded connections can also have blocking factors depending on the input/out ratios.

Figure 2:
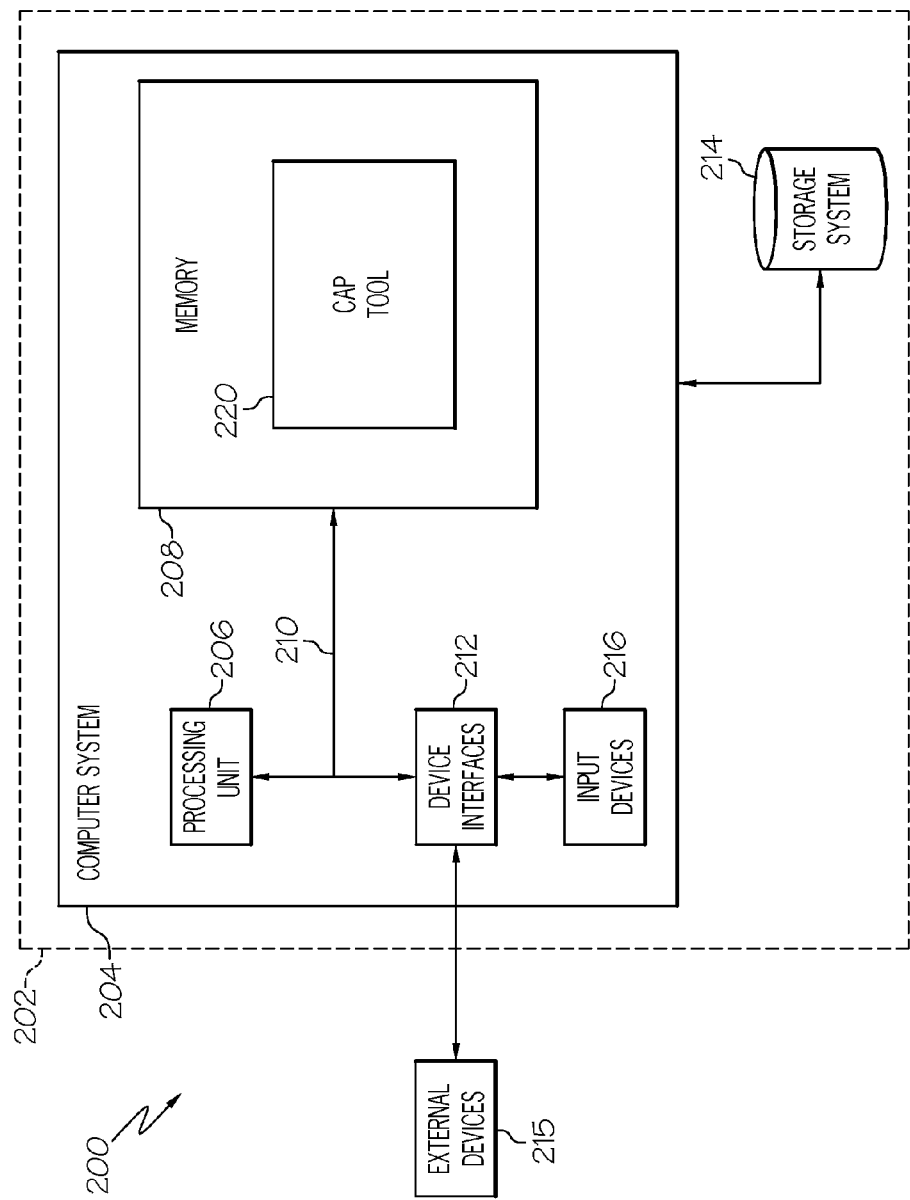
FIG. 2 shows an exemplary computing infrastructure for optimizing a network composition and component configuration in a dense server environment according to embodiments of the invention.

As applied to the present invention, embodiments described herein can calculate, for a set of nodes, exactly how many switches and connections need to be made to implement a logical Clos network with a specified blocking factor and/or redundancy for failover, while also factoring in maximum rack capacities such as total space, electrical power, cooling, weight, etc., which directly impact the number of switches and blocking factors for connectivity. In an exemplary embodiment, this is accomplished using a component automated placement (CAP) tool 220, which is shown in FIG. 2. CAP tool 220 creates an optimized network and component placement for densely populated rack-based configurations, e.g., made of thousands of servers. CAP tool 220 accomplishes at least the following: (1) creates for each rack an optimized top-of-the rack Clos-style network based on the set of requirements specified for the servers, racks, switches and other devices; (2) specifies an optimized rack placement that generates point-to-point connections for components; and (3) designs optimized placement of cable-routing trays and junctions for data centers. These three elements taken together help optimize the number of cables, quantity of multiplexed connections, cable lengths and switch/component placement.

For example, consider an iDataPlex® rack, which has 84U of server space and an additional 16U of space for switches and power PDUs in side pockets. (iDataPlex® is a registered trademark of International Business Machines Corp. in at least the United States) In this case, if all 84U are populated with 84 servers, the system would need 5×36-port switches, which leaves vacant 6 ports. If a designer wishes to avoid wasting switch ports, he/she could deploy only 72U of space and use 4 switches, leaving vacant 12U of rack space. Another option using all 84U of server space uses a partially blocking configuration composed of switches with 21 ingress ports and 14 egress ports leading to a 3:2 blocking ratio (leaving 1 port unused per switch). Blocking factors are not the only parameter system designers have to balance. There may be weight, electrical, and HVAC considerations that may affect how a network topology can be implemented.

Another consideration that affects network planning is the composition of servers making up a rack. Since racks can be composed of different types of servers (e.g., GPU nodes, storage rich nodes, high-memory nodes, etc.) having varying sizes, calculating the network topology per rack can be complex, particularly when there may be multiple types of racks, servers, and networks involved. CAP tool 220 is capable of generating logical connectivity diagrams, which map the topology onto racks, servers and switches, thereby revealing the full range of possible configurations. As such, CAP tool 220 allows designers to better understand the trade-offs of different network blocking factors based on the racks, servers, and switches available.

Furthermore, as will be described below in greater detail, CAP tool 220 optimizes the positions of cable trays with cross-over junctions. For example, network cables in high performance computing (HPC) data centers are placed in cable trays of various sizes and partitions for protection and organization. CAP tool 220 uses a combinatorial optimization algorithm to position the trays, as well as the junctions between trays, to simplify cable routing. Furthermore, if a data center already has an existing cable tray management system, CAP tool 220 can calculate cable lengths using or augmenting the system.

Still furthermore, as will be described in greater detail below, CAP tool 220 provides rack positioning to optimize cable lengths. In a data center, planning the positions of racks is defined by many factors including airflow, electrical power availability, weight bearing conditions, etc. Within the context of these conditions, CAP tool 220 adds the ability to plan individual rack positions to optimize cable lengths, i.e., minimize an amount of cable provided, while still ensuring cable lengths adequate enough to prevent an unexpected shortage. As HPC cables are often priced based on length, reducing their lengths lowers the overall cost of the system.

Referring again to FIG. 2, a computerized implementation 200 of an exemplary embodiment for optimizing a network composition and component configuration in a dense server environment will be described in greater detail. As depicted, implementation 200 includes computer system 204 deployed within a computer infrastructure 202. This is intended to demonstrate, among other things, that the present invention could be implemented within a network environment (e.g., the Internet, a wide area network (WAN), a local area network (LAN), a virtual private network (VPN), etc.), a cloud-computing environment, a cellular network, or on a stand-alone computer system. Communication throughout the network can occur via any combination of various types of communication links. For example, the communication links can comprise addressable connections that may utilize any combination of wired and/or wireless transmission methods. Where communications occur via the Internet, connectivity could be provided by conventional TCP/IP sockets-based protocol, and an Internet service provider could be used to establish connectivity to the Internet. Still yet, computer infrastructure 202 is intended to demonstrate that some or all of the components of implementation 200 could be deployed, managed, serviced, etc., by a service provider who offers to implement, deploy, and/or perform the functions of the present invention for others.

Computer system 204 is intended to represent any type of computer system that may be implemented in deploying/realizing the teachings recited herein. In this particular example, computer system 204 represents an illustrative system for optimizing a network composition and component configuration in a dense server environment. It should be understood that any other computers implemented under the present invention may have different components/software, but can perform similar functions. As shown, computer system 204 includes a processing unit 206 capable of communicating with CAP tool 220 stored in memory unit 208, a bus 210, and device interfaces 212. In general, CAP tool 220 can be implemented as program/utility on computer system 204 and can enable the functions recited herein. As further shown, CAP tool 220 (in one embodiment) comprises a rules and/or computational engine that processes a set (at least one) of rules/logic for optimizing a network composition and component configuration in a dense server environment.

Processing unit 206 refers, generally, to any apparatus that performs logic operations, computational tasks, control functions, etc. A processor may include one or more subsystems, components, and/or other processors. A processor will typically include various logic components that operate using a clock signal to latch data, advance logic states, synchronize computations and logic operations, and/or provide other timing functions. During operation, processing unit 206 collects and routes signals representing inputs and outputs between external devices 215 and input devices 216. The signals can be transmitted over a LAN and/or a WAN (e.g., T1, T3, 56 kb, X.25), broadband connections (ISDN, Frame Relay, ATM), wireless links (802.11, Bluetooth, etc.), and so on. In some embodiments, the signals may be encrypted using, for example, trusted key-pair encryption. Different systems may transmit information using different communication pathways, such as Ethernet or wireless networks, direct serial or parallel connections, USB, Firewire®, Bluetooth®, or other proprietary interfaces. (Firewire is a registered trademark of Apple Computer, Inc. Bluetooth is a registered trademark of Bluetooth Special Interest Group (SIG)).

In general, processing unit 206 executes computer program code, such as program code for operating CAP tool 220, which is stored in memory 208 and/or storage system 214. While executing computer program code, processing unit 206 can read and/or write data to/from memory 208, storage system 214, and CAP tool 220. Storage system 214 can include VCRs, DVRs, RAID arrays, USB hard drives, optical disk recorders, flash storage devices, and/or any other data processing and storage elements for storing and/or processing data.

Figure 3A:
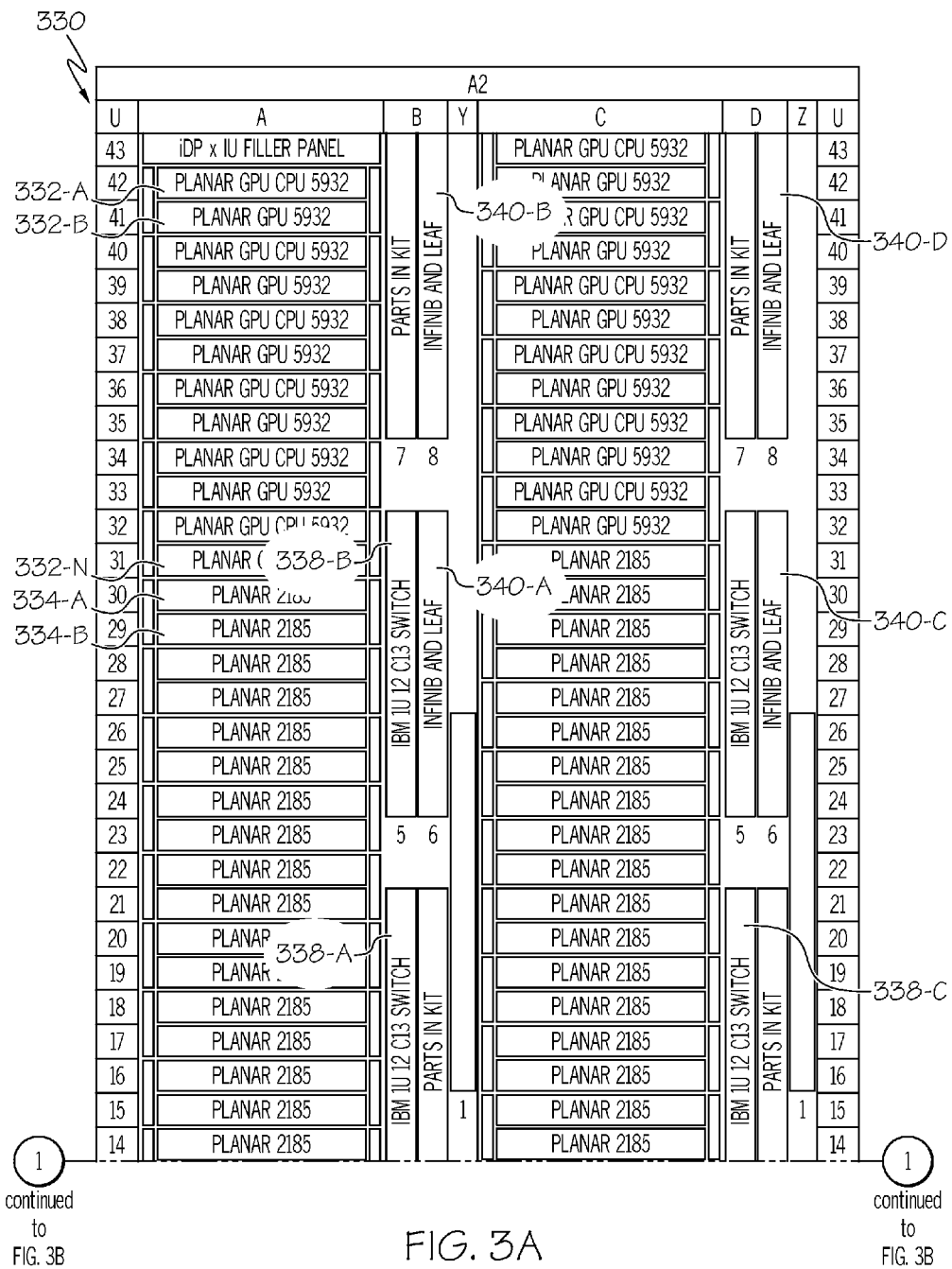
FIGS. 3A and 3B show an exemplary rack according to embodiments of the invention.
Figure 3B:
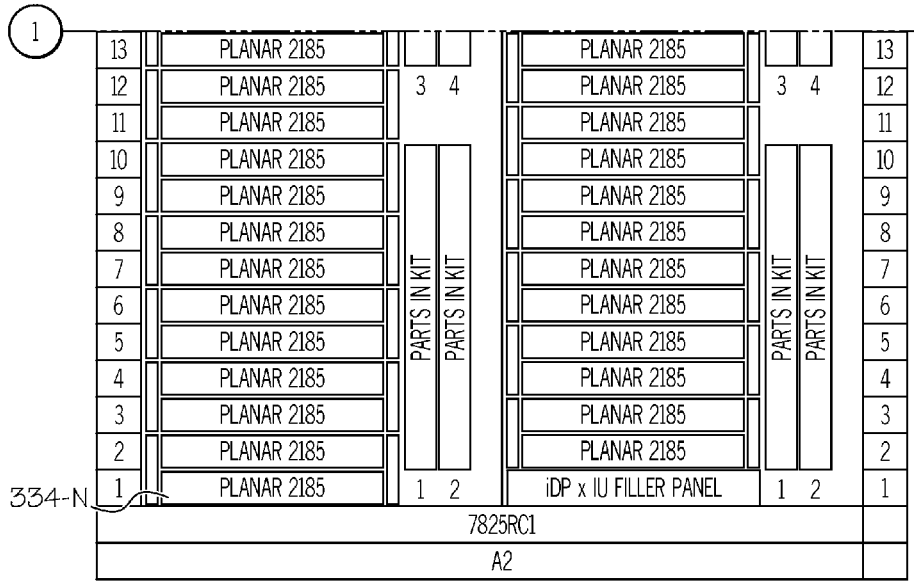

Referring now to FIGS. 3A and 3B, the operation of CAP tool 220 (FIG. 2) will be described in greater detail. Initially, CAP tool 220 is configured to select and build, for each individual rack, an optimized size and configuration based on a set of requirements, wherein the requirements specify parameters of compute nodes N, switches S, racks R, network blocking-factor/type B, power distribution units PDUs, cable trays T, data center DC, etc. In one embodiment, the following non-limiting modeling syntax describes the items and characteristics of the requirements in more detail. In this case, there are seven primary n-tuples whose parameters are specified to define the particular search space: rackStandard( ), rackIdataplex( ), switch( ), server( ), cable( ), device( ) and cable( ). Two additional n-tuples that regulate the type of test and output style are testType( ) and output( ). Each key type may have a number of modifying n-tuples enclosed in brackets.

1. testType(threads, ranSeed, type, depth, inFile, variations)
    threads=maximum number of parallel threads [int]
    ranSeed=Random number seed, 0 means a value computed by time( )ˆ getpid( ). The output results display the seed used, so re-entering that seed again runs the same simulation. [int]
    type=Type of optimization search {GREEDY|KNAPSACK|DIVIDE}[str]
    depth=Depth of search tree [int]
    inFile=Input file name [str]
    variations=Max variation [int]
2. output(outFile, format)
    outFile=output file name [str]
    format=format for output file {ASCII|SPREADSHEET|BINARY}[str]
3. rackStandard(flag, name, positionX, positionY, width, depth, height, units, maxWeight, maxPower, range)
4. rackIdataplex(flag, name, positionX, positionY, width, depth, height, units, maxWeight, maxPower, range)
    flag=rack characteristics [int]
    name=rack name [str]
    positionX=the location [int]
    positionY=the location [int]
    width=rack width [int]
    height=rack height [int]
    units=available rack units [int]
    maxWeight=max weight rack can hold [int]
    maxPower=max Power for rack in Watts [int]
    range=range for repeated racks [int]
5. switch(flag, type, max-ports, size, role, power, weight)
    flag=switch characteristics [int]
    name=type of switch [str]
    max-ports=number of ports [int]
    role=role of switch [str]
    power=power in Watts [int]
    weight=weight [int]
6. server(flag, nodeType, size, power, connections, compatibility, quantity)
    flag=server characteristics [int]
    nodeType=server name [str]
    size=number of units server occupies [int]
    power=number of Watts [int]
    compatibility=intermix in rack with other nodes [str]
    quantity=number to configure [int]
7. network(flag, type, blocking-ratio/uplink, leaf type, core type, size)
    flag=characteristic flag [int]
    type=network type [str]
    blocking-ratio/uplink=type of Clos interconnect [str]
    leaf type=leaf switch type [str]
    core type=core switch type [str]
8. cable(flag, name, length)
    flag=cable type and characteristics [int]
    name=cable name [str]
    length=cable length [int]
9. device(flag, name, unitSize, weight, power, range)
    flag=device type and characteristics [int]

name=device name [str]
unitSize=size it occupies in slots [int]
weight=weight of device [int]
power=power consumed in Watts [int]
range=device range [int]

In an exemplary embodiment, CAP tool 220 is configured to receive a set of these user-selected requirements that specify at least a type, quantity, and a characteristic(s) of one or more of the following components: compute nodes, switches, racks, and cable trays. Furthermore, CAP tool 220 also optimizes from a selection of racks, as sometimes there are multiple choices available, e.g., different sizes. From this, CAP tool 220 constructs a plurality of populated racks, each one having an optimized size, composition, and placement of internal elements, which is accomplished by arranging the set of elements in a dense configuration.

Consider the following non-limiting example, in which a user specifies the following system requirements:

1. Nodes: 840 compute (1U), 168 GPU (2U), 60 Hadoop (3U), 8 login (1U), 12 Management (1U), 6 File Server (2U dual IB), 4 Scheduler (1U), 6 Tape/Archive (2U), 6 Interface (2U)
2. Fully non-blocking Infiniband FDR network leaf connecting to central core
3. Gigabit management network
4. Mellanox 36-port Infiniband switches
5. iDataPlex rack
6. standard rack
7. BNT 24-port Gigabit switches Using the modeling syntax provided above, these requirements are translated into descriptive vectors (DV) such as the following:

8. server(idataplex node, 1U, 200 Watts, 2 kg, 1×Infiniband, 1×Gigabit, idataplex, 1000)
9. server(idataplex node+GPU, 2U, 300 Watts, 2 kg, 1×Infiniband, 1×Gigabit, idataplex, 400)
10. server(x3630, 2U, 300 Watts, 8 kg, 1×Infiniband, 1×Gigabit, 1×10GigE, Hadoop, all, 200)
11. server(x3650, 2U, 450 Watts, 12 kg, 2×Infiniband, 1×Gigabit, all, 18)
12. server(x3550, 1U, 200 Watts, 6 kg, 1×Infiniband, 1×Gigabit, all, 24)
13. network(Infiniband, 1:1 (non-blocking), SX-6036, SX-6518)
14. network(Gigabit, 10 Gig uplink, SMC, BNT6524)
15. switch(Infiniband, 36-port, 1U, leaf, 200 Watts, 1 kg)
16. switch(Gigabit, 48-port, 150 Watts, 1 kg, 1U)
17. switch(Infiniband, 684-port, core, 2880 Watts, 1100 kg, 28U)
18. rack(idataplex, 84U server, 16U switch/PDU, 2500 kg (Max), 32 Kilowatts (Max))
19. rack(standard, 42U server, 8U PDU, 2000 kg (Max), 26 Kilowatts (Max)).

Based on these descriptive vectors, CAP tool 220 computes an optimized rack decomposition by formulating the DV elements as a search for an optimized solution to a multidimensional knapsack problem. In one case, using a dynamic programming approach, the best/optimal combination for all knapsack sizes up to a rack size R is computed.

Specifically, in a first step, CAP tool 220 defines stopping and optimal criteria. That is, the requested quantity of compute nodes of each type are configured with the required networks. Each rack is then configured with the maximum number of servers it can hold with the minimum number of vacant slots/switch ports, while still meeting blocking, weight, and power criteria.

In a next step, several baseline values are computed for each rack/server. Using the baseline values as the starting point, CAP tool 220 iteratively attempts to improve and further optimize the configuration. In one embodiment, combinations for each server/switch are calculated for a range of network blocking values. For example, an iDataPlex rack can contain a maximum of 84×1U servers. Using industry standard 36-port Infiniband switches, a minimum of 3 switches is needed, resulting in a blocking factor of 7:2, which translates to 28 input and 8 output for each switch. As described previously, 72 servers in a 1:1 blocking use 4×36-port switches. If all 84-nodes are in a 1:1 ratio, 5×36-port switches and 4 ports are left vacant. From this, a combination of the number of servers that fit within the weight envelope is calculated for each rack/server. For example, a fully loaded iDataPlex rack can hold a maximum of 84×1U servers. GPUs servers are 2U, so the maximum would be 42. Finally, a combination of the number of servers that fit within the power envelope is calculated for each rack/server.

In a next step, the baseline calculations from the first step are further improved by iteratively trying servers, racks, and switches, while staying within the boundaries specified. For example, the 1:1 blocking baseline value can be improved with 72×1U nodes, which leaves vacant 12U of space in the iDataPlex rack. By substituting 12×2U GPU nodes, a rack can be completely filled, which leaves no vacant switch ports (60×1U servers and 12×2U GPU servers). Similarly, for the other baseline values, other servers, switches, etc. can be experimented with to improve the solutions. This represents a knapsack type solution using a bottom up approach to improve the solution with a specific optimality condition.

In a next step, conditions may be imposed that restrict the solution space search in the previous step. For example, racks may be required to aggregate only similar type servers (e.g., 1U servers and 2U GPU servers cannot be mixed in the same rack). Furthermore, racks are not compatible with all servers, e.g., x3630 servers cannot fit into iDataPlex racks. To accommodate for this, CAP tool 220 considers and adheres constraints such as an affinity of server/network components with a specific type of rack.

In a next step, a set of leaf switches that link to a central set of switches in a Clos-network is analyzed. Having redundant central switches to which all the racks connect for avoiding single points of failure is also configurable. CAP tool 220 distributes the connections to the redundant central switches by equally spreading the connection from the peripheral switches. The positioning of these central switches is addressed below.

In one embodiment, each rack contains multiple leaf switches. For consistent network fabric behavior, especially in Infiniband, the number of links from the leaf switches should be uniform. That is, each leaf should contribute the same amount of uplinks. Solutions that do not uniformly spread the servers across the leaf switches are penalized, such as the 1:1 blocking for 84×1U nodes suing 5×36-port switches. There can be multiple networks in a rack, and the switches implementing the networks may compete with the servers for rack space. This is the case for standard 42U racks.

In an exemplary embodiment, CAP tool 220 performs each step, thereby constructing one optimized rack at a time until the stopping conditions listed in the first step are met. The final solution may contain multiple valid configurations. Furthermore, a user can specify a range of blocking factors or redundancy for failover, which will result in multiple valid solutions.

Consider the following example, which specifies a non-blocking Infinband network and a Gigabit management network. Here, a possible configuration is calculated containing 20 racks with 62 Infiniband switches and 48 Gigabit switches that have uplinks to central switches. In FIGS. 3A and 3B, one such exemplary rack 330 is shown. In this case, rack 330 is an optimized iDataPlex rack, which is the knapsack with servers, switches, and devices represented as the items being selected for the knapsack. Rack 330 includes a plurality of graphical processing unit (GPU) compute nodes 332A-N, compute nodes 334A-N, switches (e.g., Gigabit) 338A-C, and Infiniband switches 340A-D. In its entirety, the solution may comprise the following:

1. 14 racks of iDataPlex (840 Compute, 168 GPU) with each containing
   60×1U compute nodes
   12×2U GPU nodes
   4×36-port Infinband switches (4×18 Infiniband uplinks)
   3×24-port Gigabit switches (3×3 10 Gigabit uplinks)
2. 3 Standard (42U) racks each with:
   10×3U Hadoop nodes
   1×2U File server node with dual Infiniband links
   2×2U Interface Nodes
   4×1U Management nodes
   1×36-port Infiniband switch (18×Infiniband uplinks)
   1×24-port Gigabit switch (7-ports vacant with 1×10 Gigabit uplink)
3. 2 Standard (42U) racks each with:
   10×3U Hadoop nodes
   2×2U Tape/Archive nodes
   1×2U File server node with dual Infiniband links
   4×1U Login nodes
   1×36-port Infiniband switch (18×Infiniband uplinks)
   1×24-port Gigabit switch (7-ports vacant with 1×10 Gigabit uplink)
4. 1 Standard (42U) rack with:
   10×3U Hadoop nodes
   1×2U Filer server node with dual Infiniband links
   2×2U Tape/Archive nodes
   1×2U Interface node
   4×1U Scheduler nodes
   1×36-port Infiniband switch (18×Infiniband uplinks)
   1×24-port Gigabit switch (7-ports vacant with 1×10 Gigabit uplink)

The running time of this phase is O(R×C×S×N×B) where R=number of Rack dimensions*Rack Types, C=number of Compute Nodes Types, S=number of Switch Types, N=number of Networks, and B=number of Blocking-Ratios. This algorithm operates on integers with a finite search space (i.e., no real numbers). Because this algorithm operates on a single rack at a time, not simultaneous multiple racks, the problem remains tractable. The solution above optimizes Infiniband switches in a non-blocking configuration to leave no vacant Infiniband switch ports per rack. Furthermore, an affinity parameter (i.e., a type flag listed in the characteristics specified in the n-tuple listed above) specifies which server types can mix, e.g., all GPU nodes can be aggregated together for ease of system administration. Such conditions reduce the optimization search space since servers need to be treated as a block scheduled together.

Figure 4:
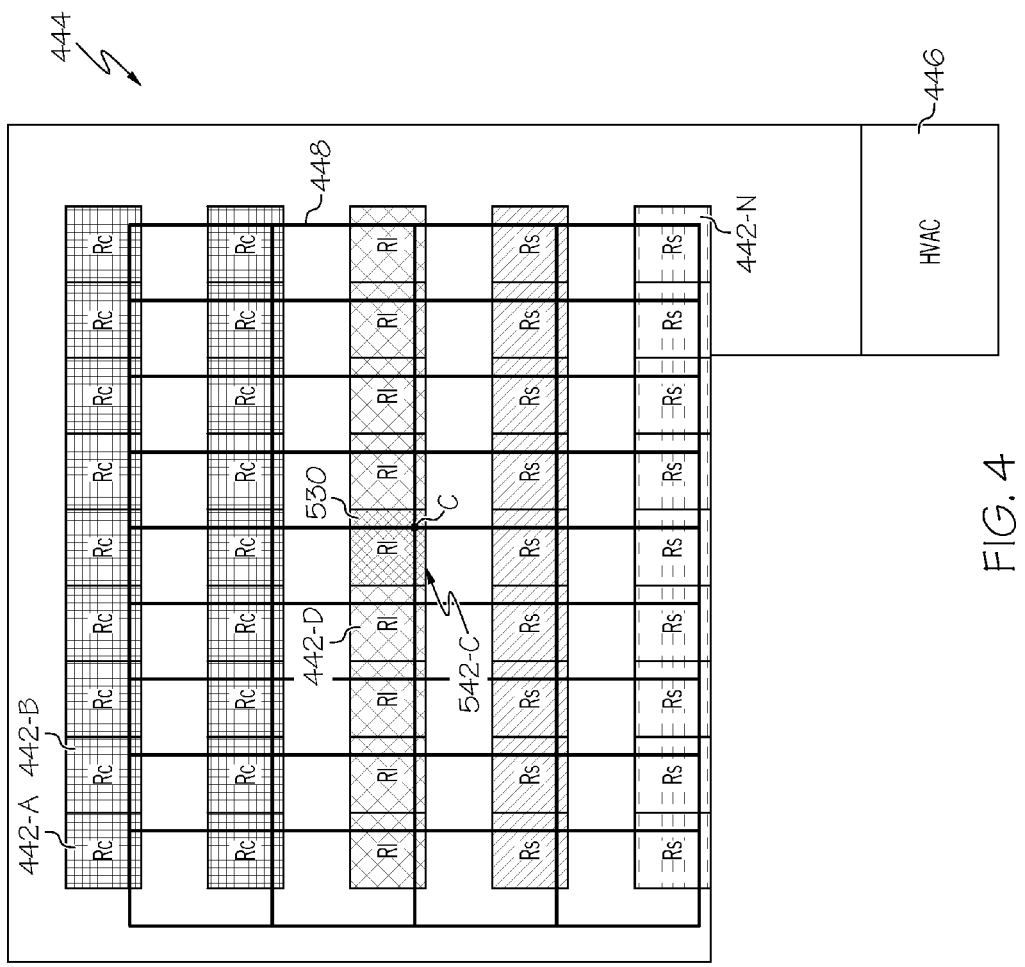
FIG. 4 shows an exemplary rack configuration in a data center according to embodiments of the invention.

Turning now to FIG. 4, an approach will be described for configuring the plurality of populated racks in a system topology to minimize cable lengths and network connections between populated racks, while maximizing the quality of the network connections. This step takes as input a set of racks populated/optimized as described above, each specifying the number of uplinks to the central switches in the Clos-network. Specifically, an optimized layout for these racks is determined within a data center 444, the layout minimizing intra-rack cable lengths, while also adhering to power requirements, cooling requirements, weight requirements, etc., in datacenter 444. It will be appreciated that CAP tool 220 operates on a wide range of data center shapes and sizes, including those with multiple floors and levels. For simplicity, FIG. 4 shows data center 444 operating on a single-floor, recto-linear type shape containing 45 spaces 442A-N for racks in 5 horizontal rows. This type of row/column layout can be used in data centers, e.g., to accommodate hot/cold aisles and leave space between racks for service personnel. As shown, data center 444 further includes an HVAC unit 446, which impacts the number of switches and blocking factors for connectivity. That is, the position of HVAC unit 446 within datacenter 444 influences switch placement, which in turn affects cable lengths and associated cable costs. In addition, to avoid high cable run costs, larger switches can be deployed, which translates to fewer switches overall.

In this example, it is first determined where to place the central switches of the Clos-network, which corresponds to the middle layer of switches (M×M) in FIG. 1. In a Clos-network, the servers connect through intermediate switches, so there are no direct server-to-server connections. To address this issue, data center 444 is re-formulated as a graph theoretic problem of finding the center of a graph. For simplicity of discussion, the embodiments demonstrated here are based on Manhattan wiring for the cabling channels. Manhattan wiring restricts connections to right angles, and is shown in FIG. 4 as a grid 448 super-imposed on rack spaces 442A-N. Each edge represents the distance between racks. Rack spaces 442A-N represent the nodes of grid 448, and the edges between nodes indicate adjacent neighbors. Because this network is restricted to Manhattan style of wiring, a node can have at most 4 neighbors (top, bottom, left and right), and there are no diagonal connections. To find the center C of such a graph, a Floyd-Warshall algorithm is implemented that runs O($n^3$), where n=number of rack spaces. The Floyd-Warshall algorithm also computes the all-pairs shortest path, which can be used to decide the order in which to populate racks spaces 442A-N. From the center of the graph C a sequence of rack spaces is constructed from the closest to furthest (C0, C1, C2, C3, . . . ) where C0 is C which has a distance 0.

Figure 5:
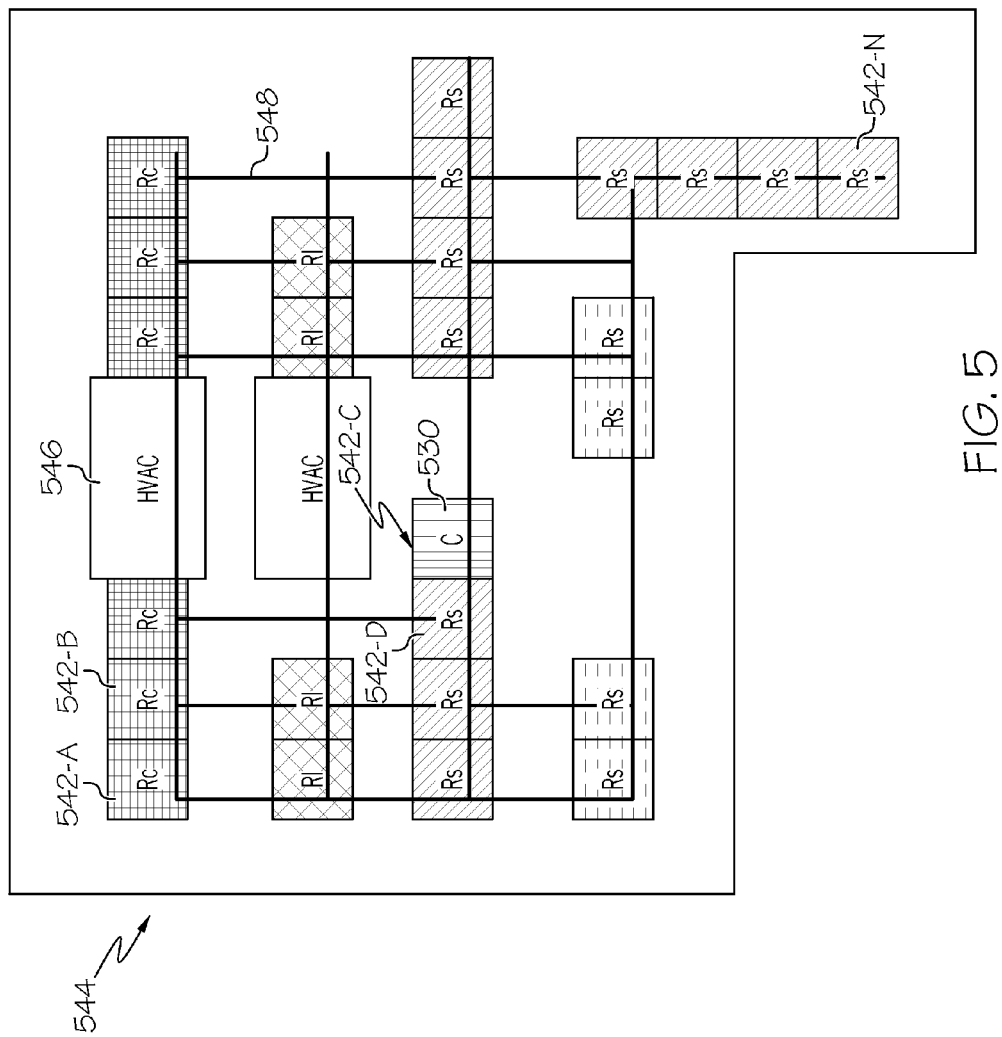
FIG. 5 shows an exemplary rack configuration in a data center according to embodiments of the invention.

Next, positioning of the racks is addressed. In this embodiment, the plurality of racks (R1, RS, RC, etc.) are prioritized based on the number of uplinks to the central switch(es). That is, the rack with the most uplinks, e.g., rack 430, is placed in rack space 442-C, which is closest to the center of the graph C, thereby minimizing the cable lengths from it to the center. The rack with the next most uplinks is then selected and assigned to rack space 442-D, and the process continues until all racks are assigned a location. In the case of data system 444, this is relatively easy to compute because grid 448 is uniform. However, this approach can be applied to other, more complex layouts, such as the one found in data center 544 in FIG. 5. In this case, data center 544 may include hundreds of racks, arranged in varying configurations due to physical partitions, security measures, etc. Despite this more complex rack space organization, data center 544 is again re-formulated as a graph theoretic problem of finding the center of a graph, wherein grid 548 is super-imposed over the components of data center 544. To find the center C of grid 548, the Floyd-Warshall algorithm is implemented that runs $O(n^3)$, where n=number of rack spaces. This algorithm computes the all-pairs shortest path, which is used to decide the order in which to populate racks spaces 542A-N. From the center of the graph C a sequence of rack spaces is constructed from the closest to furthest (C0, C1, C2, C3 . . . ) where C0 is C which has a distance 0. The plurality of racks (R1, RS, RC, etc.) are prioritized based on the number of uplinks. Again, the rack with the most uplinks, e.g., rack 530, is placed in rack space 542-C, which is closest to the center of the graph C, thereby minimizing the cable lengths from it to the center. The rack with the next most uplinks is then selected and assigned to rack space 542-D, and the process continues until all racks are assigned a location.

Additionally, there can be other types of constraints placed in the rack assignment step. For example, some racks may require water-cooling, which is only available at designated locations. Constraints like these may require CAP tool 220 to re-order rack assignment step to not strictly follow the largest to smallest uplink order. Overall, the algorithm is heavily influenced by the $O(n^3)$ running time of the center of graph calculation that generates all-pairs shortest paths.

Figure 6:
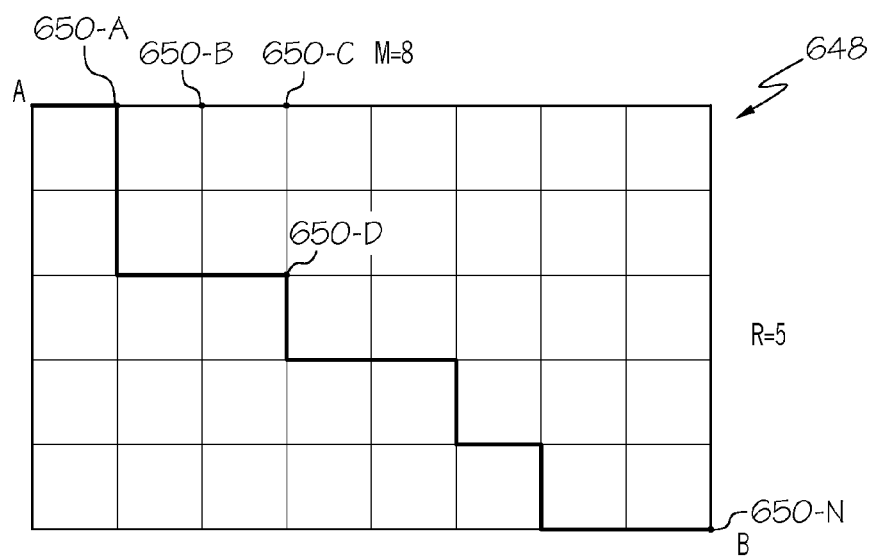
FIG. 6 shows a cable tray and junction layout according to embodiments of the invention.

Turning now to FIG. 6, an approach for calculating tray positions will be described in greater detail. In this step, CAP tool 220 takes as input the rack positions as determined above, and computes an optimized cable tray and junction layout. That is, in FIGS. 4-5, the center of each respective grid 448 and 548 is calculated using a complete grid for the cable channels. These structures are then simplified so as to not require as many cable channels. Consider the following grid 648 of FIG. 6, which corresponds to a plurality of Manhattan wiring cable channels. This has a full grid of cable trays and junctions 650A-N. This structure is simplified based on the observation that every path from point a to point b travels a path composed of 8 horizontal and 5 vertical links for a total length of 13 links. There are $(8+5)!/(8!*5!)$ possible paths for such grid 648, all of which are the same length.

Figure 7:
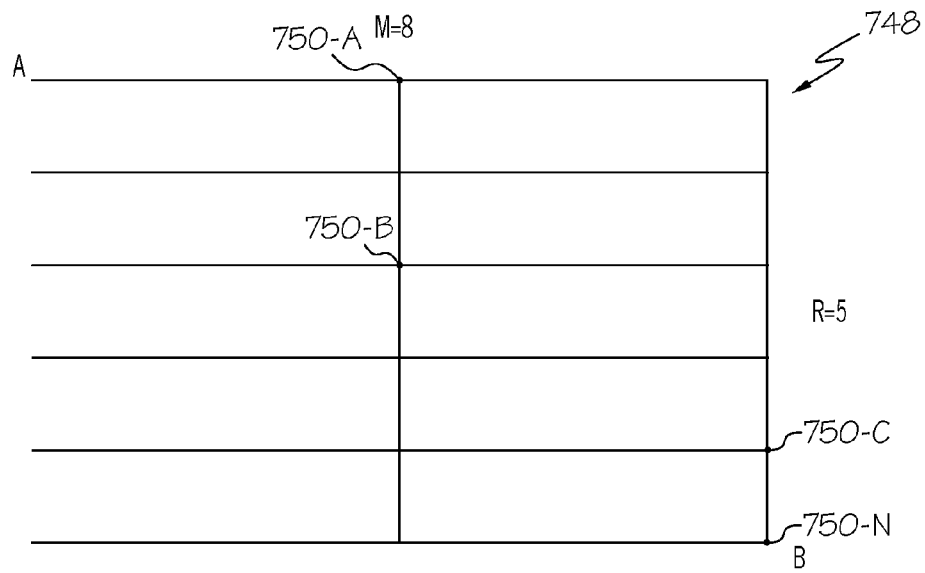
FIG. 7 shows an optimized cable tray and junction layout according to embodiments of the invention.
Figure 8:
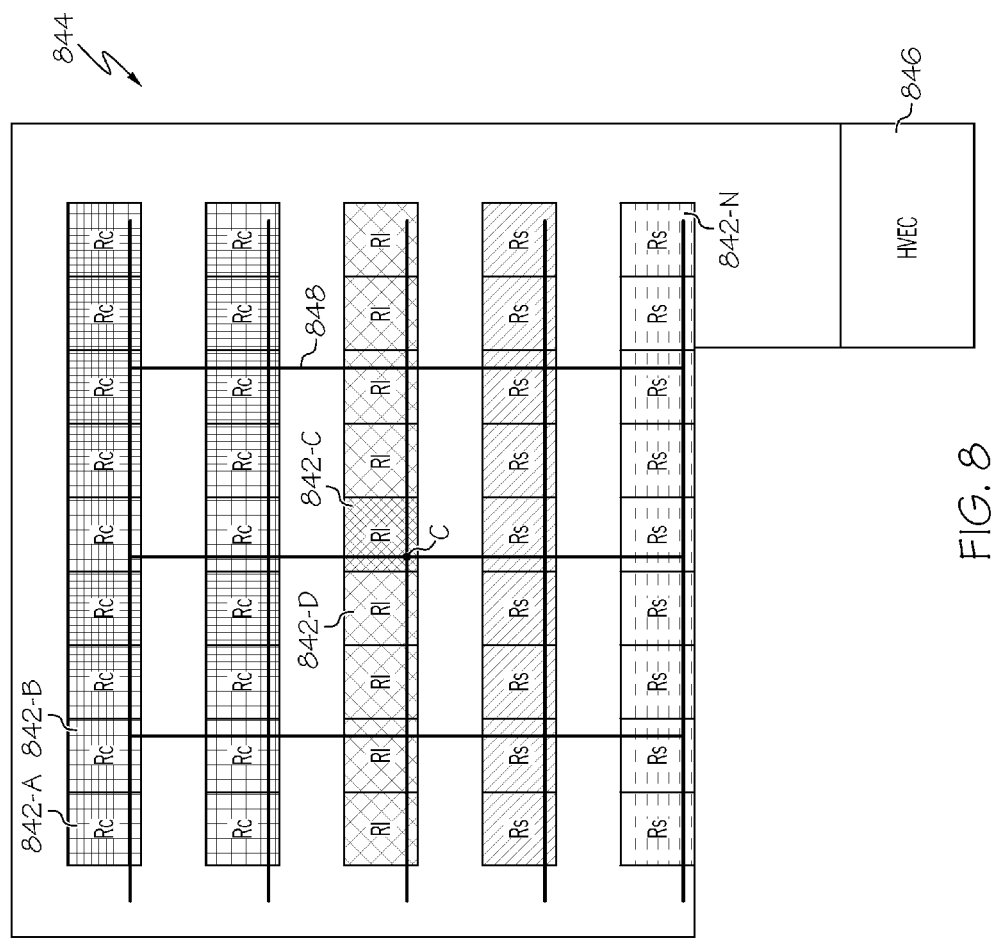
FIG. 8 shows a simplified rack scheme according to embodiments of the invention.

Grid 648 can be replaced with simpler cable tray configuration, e.g., as shown in FIG. 7. This grid/cable tray scheme 748 enables the same length path for cables from point a to point b without the complexity present in grid 648 of FIG. 6, where all $(m+n)!/(m!*n!)$ paths are available. Performing this process reduces cable tray complexity by simplifying grid 748 to have the same equivalent path lengths, but with fewer cable trays and junctions 750A-N. In this embodiment, processing starts from the four outer corners and proceeds towards the center of grid 748, thus simplifying the solution by replacing the complex structure of completed grid 748 with a simplified substitute. In the case of previously described grid 448 of FIG. 4, simplification results in the structure shown in FIG. 8. Here, grid 848 is further simplified by removing the two outer channels. As shown, grid 848 has far fewer junctions, yet the cabling lengths remain the same. In a complex rack scheme, the simplification can be done in sub-blocks working towards the center, taking into account any number of additional other factors, such as cable weights and volumes. In such situations, the process can proceed with a parametric value that constrains the size of the grid to be simplified. That is, the parametric value species the number of sub-blocks, which controls the simplification factor of how many redundant paths are deployed for the cable trays. As a result, CAP tool 220 optimizes the position and number of cable trays/junctions, cable lengths, and cable tray channels in data center 844, while adhering to a set of constraints within the datacenter attributable to any of the following: heating ventilation air condition (HVAC) equipment, stairwells, multiple floors, generators, uninterruptable power supply devices, and water supply components (not shown).

As described herein, approaches of the invention optimize component placement for Clos-style networks composed of densely packed rack-based servers to minimize switches, cables, cable lengths and cable tray routes. This solution works for all types of clusters: System P, System Z, System X, etc. Additionally, these approaches provide a logical connectivity diagram, which maps the topology onto racks, servers and switches, thereby revealing the full range of possible configurations. For each networked component, the exact port map from device to Clos-switch is specified by the final stage.

The approach also reveals the cost tradeoffs for switches and cables in selecting different Clos-network design ratios from fully non-blocking to total over-subscription. It also reveals the cost of redundant Clos-network design costs to protect against single component failure and, if there is a plurality of networks, these are calculated independently. In one embodiment, wherein each of the set of connection points comprises an uplink to the central switch in a Clos-type network, CAP tool 220 calculates a series of cost tradeoffs, for each Clos-network, for performing each of the following: selecting different Clos-network design ratios from fully non-blocking to full over-subscription by varying combinations of switches and cables; and providing a redundant Clos-network design to protect against failure of a single component. Consider, for example, design of a system in the HPC arena. A cost benefit analysis of varying the connection ratio from non-blocking (18 input to 18 output) to fully blocking (35 input 1 output) can be substantial since for each switch we are getting nearly double the number of connections (17 more). This comes at the cost of reducing the bandwidth which can make sense if the applications are more latency sensitive. This tradeoff (and those in between) are technically acceptable because most applications (80% or more) spend only 10-15% on communication. The communication generally tends to be low-bandwidth. So only a fraction (<5%) of applications usually require full bandwidth capability in a network.

It can be appreciated that the approaches disclosed herein can be used within a computer system to optimize a network and component configuration in a dense server environment. In this case, as shown in FIG. 2, CAP tool 220 can be provided, and one or more systems for performing the processes described in the invention can be obtained and deployed to computer infrastructure 202. To this extent, the deployment can comprise one or more of (1) installing program code on a computing device, such as a computer system, from a computer-readable storage medium; (2) adding one or more computing devices to the infrastructure; and (3) incorporating and/or modifying one or more existing systems of the infrastructure to enable the infrastructure to perform the process actions of the invention.

The exemplary computer system 204 (FIG. 2) may be described in the general context of computer-executable instructions, such as program modules, being executed by a computer. Generally, program modules include routines, programs, people, components, logic, data structures, and so on, which perform particular tasks or implement particular abstract data types. Exemplary computer system 204 may be practiced in distributed computing environments where tasks are performed by remote processing devices that are linked through a communications network. In a distributed computing environment, program modules may be located in both local and remote computer storage media including memory storage devices.

Figure 9:
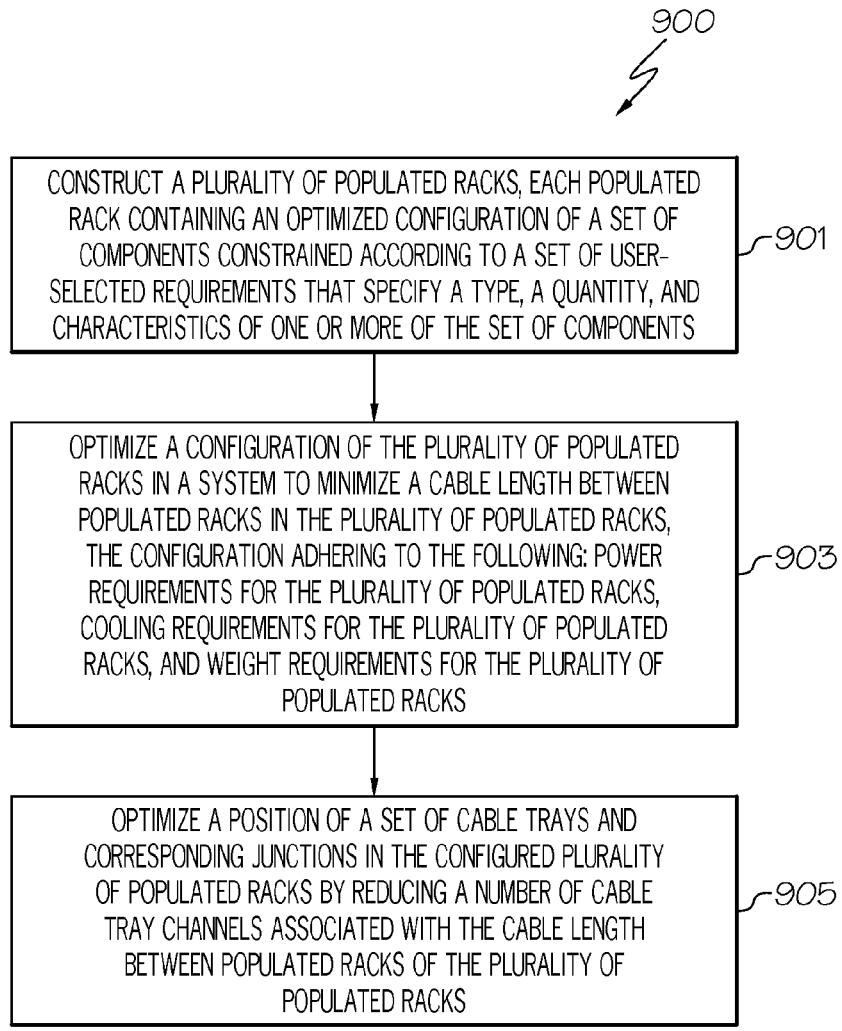
FIG. 9 shows an exemplary process flow for optimizing a network composition and component configuration in a dense server environment according to embodiments of the invention.

As depicted in FIG. 9, a system (e.g., computer system 204) carries out the methodologies disclosed herein. Shown is a process flow 900 for optimizing a network composition and component configuration in a dense server environment. At 901, a plurality of populated racks is constructed, each populated rack containing an optimized configuration of a set of components constrained according to a set of user-selected requirements that specify a type, a quantity, and characteristics of one or more of the set of components. At 903, a configuration of the plurality of populated racks in a system is optimized to minimize a cable length between populated racks in the plurality of populated racks, the configuration adhering to the following: power requirements for the plurality of populated racks, cooling requirements for the plurality of populated racks, and weight requirements for the plurality of populated racks. At 905, a position of a set of cable trays and corresponding junctions is optimized in the configured plurality of populated racks by reducing a number of cable tray channels associated with the cable length between populated racks of the plurality of populated racks.

Process flow 900 of FIG. 9 illustrates the architecture, functionality, and operation of possible implementations of systems, methods, and computer program products according to various embodiments of the present invention. In this regard, each block in the flowchart may represent a module, segment, or portion of code, which comprises one or more executable instructions for implementing the specified logical function(s). It should also be noted that, in some alternative implementations, the functions noted in the blocks might occur out of the order depicted in the figures. For example, two blocks shown in succession may, in fact, be executed substantially concurrently. It will also be noted that each block of flowchart illustration can be implemented by special purpose hardware-based systems that perform the specified functions or acts, or combinations of special purpose hardware and computer instructions.

Some of the functional components described in this specification have been labeled as systems or units in order to more particularly emphasize their implementation independence. For example, a system or unit may be implemented as a hardware circuit comprising custom VLSI circuits or gate arrays, off-the-shelf semiconductors such as logic chips, transistors, or other discrete components. A system or unit may also be implemented in programmable hardware devices such as field programmable gate arrays, programmable array logic, programmable logic devices or the like. A system or unit may also be implemented in software for execution by various types of processors. A system or unit or component of executable code may, for instance, comprise one or more physical or logical blocks of computer instructions, which may, for instance, be organized as an object, procedure, or function. Nevertheless, the executables of an identified system or unit need not be physically located together, but may comprise disparate instructions stored in different locations which, when joined logically together, comprise the system or unit and achieve the stated purpose for the system or unit.

Further, a system or unit of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices and disparate memory devices.

Furthermore, systems/units may also be implemented as a combination of software and one or more hardware devices. For instance, CAP tool 220 may be embodied in the combination of a software executable code stored on a memory medium (e.g., memory storage device). In a further example, a system or unit may be the combination of a processor that operates on a set of operational data.

As noted above, some of the embodiments may be embodied in hardware. The hardware may be referenced as a hardware element. In general, a hardware element may refer to any hardware structures arranged to perform certain operations. In one embodiment, for example, the hardware elements may include any analog or digital electrical or electronic elements fabricated on a substrate. The fabrication may be performed using silicon-based integrated circuit (IC) techniques, such as complementary metal oxide semiconductor (CMOS), bipolar, and bipolar CMOS (BiCMOS) techniques, for example. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor devices, chips, microchips, chip sets, and so forth. However, the embodiments are not limited in this context.

Any of the components provided herein can be deployed, managed, serviced, etc. by a service provider that offers to deploy or integrate computing infrastructure with respect to a process for optimizing a network composition and component configuration in a dense server environment. Thus, embodiments herein disclose a process for supporting computer infrastructure, comprising integrating, hosting, maintaining and deploying computer-readable code into a computing system (e.g., computer system 204), wherein the code in combination with the computing system is capable of performing the functions described herein.

Also noted above, some embodiments may be embodied in software. The software may be referenced as a software element. In general, a software element may refer to any software structures arranged to perform certain operations. In one embodiment, for example, the software elements may include program instructions and/or data adapted for execution by a hardware element, such as a processor. Program instructions may include an organized list of commands comprising words, values, or symbols arranged in a predetermined syntax that, when executed, may cause a processor to perform a corresponding set of operations.

The present invention may also be a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

It is apparent that there has been provided approaches to optimizing a network composition and component configuration in a dense server environment. While the invention has been particularly shown and described in conjunction with exemplary embodiments, it will be appreciated that variations and modifications will occur to those skilled in the art. Therefore, it is to be understood that the appended claims are intended to cover all such modifications and changes that fall within the true spirit of the invention.

What is claimed is:

1. A method for optimizing a network composition and component configuration in a server environment, the method comprising computer-implemented steps of:

constructing a plurality of populated racks, each populated rack selected so as to contain an optimized size and configuration of a set of components constrained according to a set of user-selected requirements that specify a type and a quantity of one or more of the set of components, the set of components comprising one or more of a set of servers, a set of compute nodes, and a set of switches;

optimizing a configuration of the plurality of populated racks in the server environment, wherein the configuration is based on power requirements for the plurality of populated racks, cooling requirements for the plurality of populated racks, and weight requirements for the plurality of populated racks, wherein optimization of the configuration of the plurality of populated racks comprises:

determining a set of connection points between each rack from the plurality of populated racks, wherein each of the set of connection points includes an uplink to a central switch in the server environment;

configuring the set of populated racks from the plurality of populated racks in a substantially central portion of the server environment based on a prioritized number of uplinks to the central switch, whereby minimizing the cable length between the populated racks in the plurality of racks;

and optimizing a position of a set of cable trays and corresponding junctions in the configured plurality of populated racks by reducing a number of cable tray channels associated with the cable length between populated racks of the plurality of populated racks.

2. The method of claim 1, the optimizing a position of a set of cable trays and corresponding junctions further comprising minimizing the cable length and the cable tray channels while adhering to a set of constraints within the server environment attributable to any of the following: heating ventilation air condition (HVAC) equipment, stairwells, multiple floors, generators, uninterruptable power supply devices, and water supply components.

3. The method of claim 1, the set of components further comprising one or more of the following: a network block-factor, a set of power distribution units, heating/ventilation/air-condition (HVAC) equipment, and a set of generators.

4. The method of claim 1,
wherein the set of populated racks has a relatively higher number of connection points and a relatively shorter connection distance.

5. The method of claim 1, wherein the uplink to the central switch is connected to a Clos-type network, wherein a port map from a device to the central switch is defined by the configuration of the set of populated racks in the substantially central portion of the server environment, and wherein the computer implemented step of optimizing the configuration of the plurality of populated racks further comprises:
calculating a series of cost tradeoffs, for each Clos-network, for performing each of the following:
selecting different Clos-network design ratios from fully non-blocking to full over-subscription by varying combinations of switches and cables; and
providing a redundant Clos-network design to protect against failure of a single component.

6. The method of claim 1, further comprising the computer implemented step of determining the substantially central portion of the server environment using a Floyd-Warshall algorithm that computes $O(n^3)$, wherein n is the set of rack spaces from the plurality of populated racks.

7. The method of claim 1, the constructing the plurality of populated racks comprising optimizing a composition and placement of a set of elements within each populated rack from the plurality of populated racks by arranging the set of elements in a dense configuration.

8. A system for optimizing a network composition and component configuration in a dense server environment, comprising:
a memory medium comprising program instructions;
a bus coupled to the memory medium; and
a processor, for executing the program instructions, coupled to a component automated placement (CAP) tool via the bus that when executing the program instructions causes the system to:
construct a plurality of populated racks, each populated rack selected so as to contain an optimized size and configuration of a set of components constrained according to a set of user-selected requirements that specify a type and a quantity of one or more of the set of components, the set of components comprising one or more of a set of servers, a set of compute nodes, and a set of switches;
optimize a configuration of the plurality of populated racks in the server environment wherein the configuration is based on power requirements for the plurality of populated racks, cooling requirements for the plurality of populated racks, and weight requirements for the plurality of populated racks, wherein optimization of the configuration of the plurality of populated racks comprises:
determining a set of connection points between each rack from the plurality of populated racks, wherein each of the set of connection points includes an uplink to a central switch in the server environment;
configuring the set of populated racks from the plurality of populated racks in a substantially central portion of the server environment based on a prioritized number of uplinks to the central switch, whereby minimizing the cable length between the populated racks in the plurality of racks;
and
optimize a position of a set of cable trays and corresponding junctions in the configured plurality of populated racks by reducing a number of cable tray channels associated with the cable length between populated racks of the plurality of populated racks.

9. The system according to claim 8, the program instructions further causing the system to optimize a position of a set of cable trays and corresponding junctions further comprising minimizing the cable length and the cable tray channels while adhering to a set of constraints within the datacenter attributable to any of the following: heating ventilation air condition (HVAC) equipment, stairwells, multiple floors, generators, uninterruptable power supply devices, and water supply components.

10. The system according to claim 8, the set of components further comprising one or more of the following: a network block-factor, a set of power distribution units, heating/ventilation/air-condition (HVAC) equipment, and a set of generators.

11. The system according to claim 8,
wherein the set of populated racks has a relatively higher number of connection points and a relatively shorter connection distance.

12. The system according to claim 8, wherein the uplink to the central switch is connected to a Clos-type network, wherein a port map from a device to the central switch is defined by the configuration of the set of populated racks in the substantially central portion of the server environment, and wherein the program instructions for configuring the plurality of populated racks further causes the system to:
calculate a series of cost tradeoffs, for each Clos-network, for performing each of the following:
selecting different Clos-network design ratios from fully non-blocking to full over-subscription by varying combinations of switches and cables; and
providing a redundant Clos-network design to protect against failure of a single component.

13. The system according to claim 8, further comprising program instructions causing the system to determine the substantially central portion of the server environment using a Floyd-Warshall algorithm that computes $O(n^3)$, wherein n is the set of rack spaces from the plurality of populated racks.

14. The system according to claim 8, the program instructions for constructing the plurality of populated racks further causing the system to optimize a composition and placement of a set of elements within each populated rack from the plurality of populated racks by arranging the set of elements in a dense configuration.

15. A computer program product for optimizing a network composition and component configuration in a server environment, the computer program product comprising a computer readable storage device, and program instructions stored on the computer readable storage device, to:
   construct a plurality of populated racks, each populated rack selected so as to contain an optimized size and configuration of a set of components constrained according to a set of user-selected requirements that specify a type and a quantity of one or more of the set of components, the set of components comprising one or more of the following: a set of servers, a set of compute nodes, and a set of switches;
   optimize a configuration of the plurality of populated racks in the server environment wherein the configuration is based on power requirements for the plurality of populated racks, cooling requirements for the plurality of populated racks, and weight requirements for the plurality of populated racks, wherein optimization of the configuration of the plurality of populated racks comprises:
      determining a set of connection points between each rack from the plurality of populated racks, wherein each of the set of connection points includes an uplink to a central switch in the server environment;
      configuring the set of populated racks from the plurality of populated racks in a substantially central portion of the server environment based on a prioritized number of uplinks to the central switch, whereby minimizing the cable length between the populated racks in the plurality of racks;
   and
   optimize a position of a set of cable trays and corresponding junctions in the configured plurality of populated racks by reducing a number of cable tray channels associated with the cable length between populated racks of the plurality of populated racks.

16. The computer program product of claim 15, the computer readable storage device further comprising program instructions to optimize a position of a set of cable trays and corresponding junctions further comprising minimizing the cable length and the cable tray channels while adhering to a set of constraints within the datacenter attributable to any of the following: heating ventilation air condition (HVAC) equipment, stairwells, multiple floors, generators, uninterruptable power supply devices, and water supply components.

17. The computer program product of claim 15, the set of components further comprising one or more of the following: a network block-factor, a set of power distribution units, heating/ventilation/air-condition (HVAC) equipment, and a set of generators.

18. The computer program product according to claim 15, wherein the set of populated racks having has a relatively higher number of connection points and a relatively shorter connection distance.

19. The computer program product according to claim 15, the computer readable storage device further comprising program instructions to determine the substantially central portion of the server environment using a Floyd-Warshall algorithm that computes $O(n^3)$, wherein n is the set of rack spaces from the plurality of populated racks.

20. The computer program product according to claim 15, the computer readable storage device further comprising program instructions to optimize a composition and placement of a set of elements within each populated rack from the plurality of populated racks by arranging the set of elements in a dense configuration.

* * * * *